United States Patent [19]
Bruce, Jr. et al.

[11] Patent Number: 5,646,949
[45] Date of Patent: Jul. 8, 1997

[54] METHOD AND APPARATUS FOR GENERATING INSTRUCTIONS FOR USE IN TESTING A MICROPROCESSOR

[75] Inventors: William C. Bruce, Jr.; Wai-On Law, both of Austin, Tex.; Elizabeth Marie Rudnick, Urbana, Ill.; Judith Elizabeth Laurens, Cedar Park, Tex.

[73] Assignee: Motorola, Inc., Schaumburg, Ill.

[21] Appl. No.: 658,185

[22] Filed: Jun. 4, 1996

[51] Int. Cl.$^6$ .................................................. G06F 11/00
[52] U.S. Cl. .................................................................. 371/27
[58] Field of Search ............................... 371/27, 26, 25.1; 395/183.01, 183.06, 183.08, 183.09

[56] References Cited

U.S. PATENT DOCUMENTS 5,570,376 10/1996 Kunda et al. .

OTHER PUBLICATIONS

"Verification of the IBM RISC System/6000 By A Dynamic Biased Pseudo-Random Test Program Generator," A. Aharon et al.; IBM Systems Journal, vol. 30, No. 4, 1991; pp. 527–537.

"RTPG–A Dynamic Biased Pseudo–Random Test Program Generator for Processor Verification," A. Aharon et al.; IBM Science and Technology Technical Report 88.290, Jul. 1990.

*Primary Examiner*—Vincent P. Canney
*Attorney, Agent, or Firm*—Keith E. Witek

[57] ABSTRACT

An apparatus and method for generating pseudo-random test instructions for testing a microprocessor begins by providing an array of list structures (502 through 508). Each list structure (502 through 508) contains a list of instructions, a discipline field (34), a pick field (42) and a biasing field (36). A random list of instructions is created by using a list selection discipline field to determine which list (502 through 508) is selected. The discipline field in the particular list (502 through 508) is then used to determine a manner in which instructions are selected from a list of instructions contained within the list structure. The pick field indicates how many instructions are to be selected from each selected list structure using a method determined via the discipline field. Once a number of instructions equal to the pick value has been selected, another list structure is selected as determined in the list selection discipline field until an entire test file of computer instructions is fully generated.

31 Claims, 4 Drawing Sheets

METHOD AND APPARATUS FOR GENERATING INSTRUCTIONS FOR USE IN TESTING A MICROPROCESSOR

FIELD OF THE INVENTION

This invention generally relates to a method for generating computer instructions and specifically relates to a method for generating test instructions for use in testing a microprocessor.

BACKGROUND OF THE INVENTION

In the integrated circuit industry, it is necessary for a test engineer or for software to generate test instructions which may be used in a test environment to ensure proper operation of an integrated circuit 24. In order to do so, the industry has used pseudo-random test pattern generation algorithms, such as the random test pattern generation (RTPG) scheme, to randomly generate test instruction sequences for use in testing microprocessors. In general, the use of RTPG and other similar pseudo-random test generation algorithms cannot randomly create narrowly focused and highly specific test sequences to test specific aspects of an integrated circuit. These specific test sequences, therefore, cannot be randomly generated by software, but must instead be hand written by a test engineer familiar with the integrated circuit. In addition, given this hand generated test sequence, the test engineer must then determine the proper expected result from the integrated circuit in order to insure if the hand written test sequence properly executed on the integrated circuit. Hand writing this test code and determining by hand the expected result from the integrated circuit is time consuming and not cost effective. In addition, the generation of the hand-crafted test code and hand determined expected results are very subject to human error. Therefore, the need exists for a more comprehensive test generation tool which can automatically generate narrowly-focused, highly-specialized test sequences.

DETAILED DESCRIPTION OF THE PREFERRED EMBODIMENT

Figure 1:
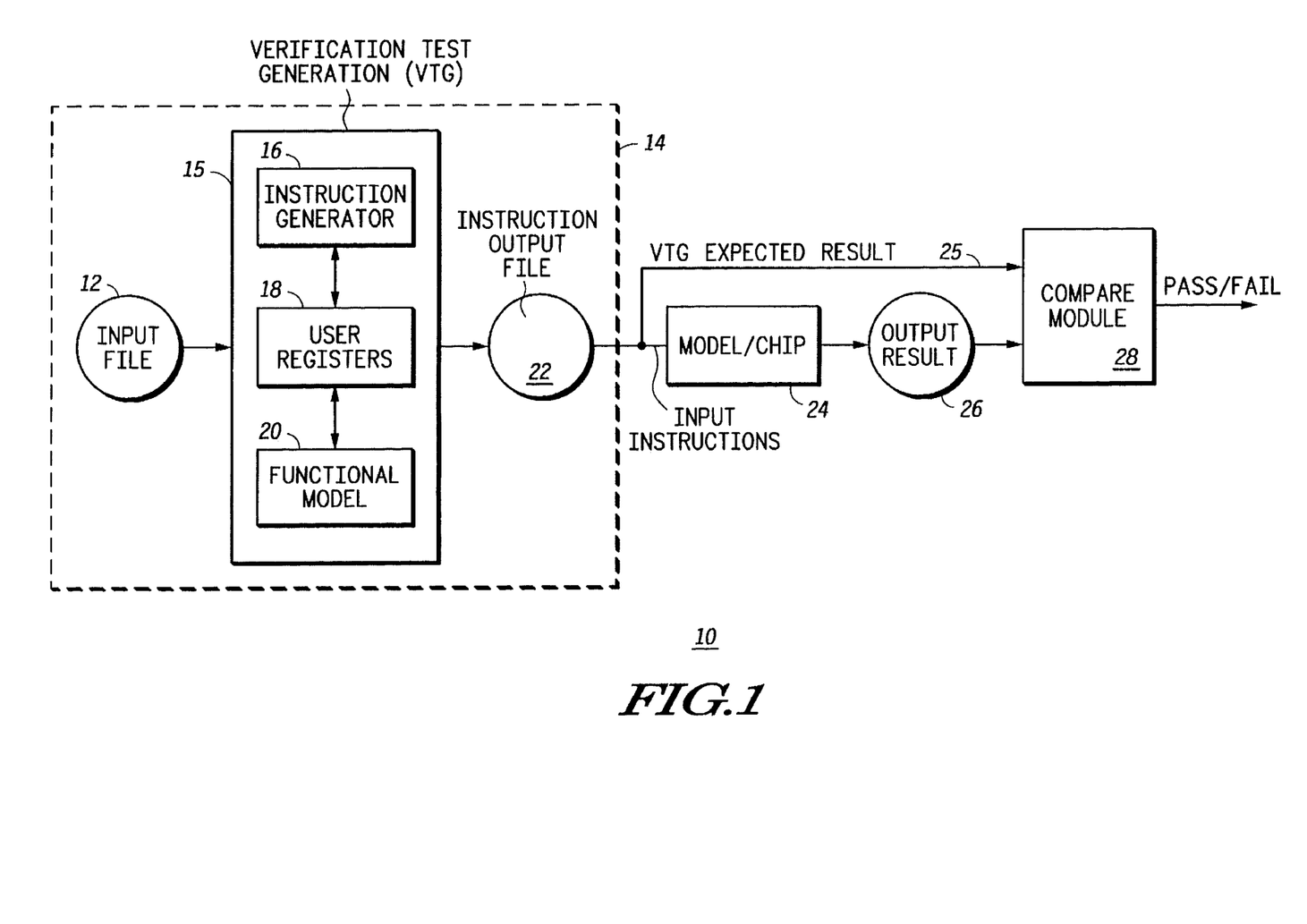
FIG. 1 illustrates, in a block diagram, a dynamically-biased pseudo-random instruction generator data flow in accordance with the present invention.

FIG. 1 illustrates in flow diagram form a dynamically-biased pseudo-random instruction generator data flow system (pseudo-random instruction generator system). The pseudo-random instruction generator system includes a verification test generator 14 (VTG), a model or chip 24, an output result 26, and a compare module 28. The VTG 14 is coupled to the model/chip 24, which in turn is coupled to output result 26, and output result 26 is coupled to compare module 28. In addition, compare module 28 is coupled to the VTG 14 and produces a pass-fail output. The VTG 14 comprises an input file 12, a VTG program 15, and an instruction output file 22. The input file is coupled to the VTG program 15, while the VTG program 15 is coupled to the instruction output file 22, and the instruction output file 22 in turn is coupled to the model/chip 24. The VTG program 15 has an instruction generator 16, shared user registers 18, and a functional model 20. The instruction generator 16 is coupled to the shared user registers 18. The shared user registers 18 are coupled to the functional model 20.

In operation, the VTG 14 performs a function of generating random instruction sequences. This generation of random instruction sequences is based upon a dynamic process whereby the VTG generator 14 has access to the current state of the user registers 18 of the functional model 20. The functional model also includes the programmer visible registers (within the user registers 18). The VTG program 15 dynamically generates instructions based on the present state of the functional model and on the biasing rules provided by the user in input file 12. This information is received by the VTG program 15 and the instruction generator 14 uses the information from the input file 12 to perform instruction generation. This will be discussed in more detail with reference to FIG. 2. The generated instructions from the VTG program 15 are ultimately stored in the instruction output file 22. Upon generation of a completed instruction output file 22, the instructions are forwarded to an external model or chip 24 which then executes the instructions in the instruction output file. The model or chip 24 produces an output result 26 which is provided to a compare module 28. The compare module 28 is coupled to the instruction output file 22 and receives a VTG expected result 25. The VTG expected result 25 and the output result 26 from the model or chip 24 are compared in the compare module 28, which in turn generates a pass-fail designator.

Figures 2, 3, 4:
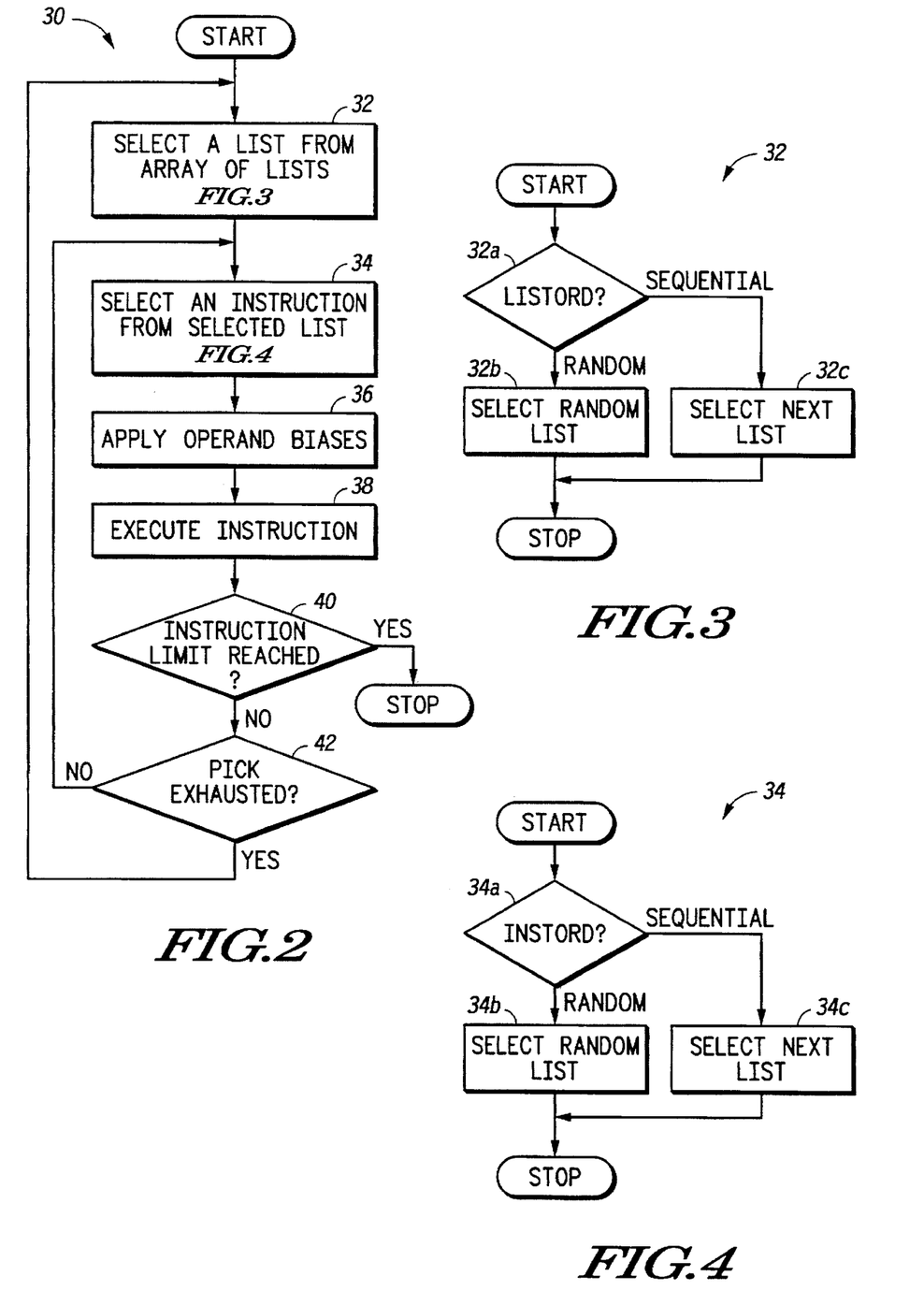
FIGS. 2-4 illustrate, in flow charts, a method for generating a random instruction sequence to apply as a test program to a microprocessor in accordance with the present invention.

FIG. 2 illustrates in flow diagram form the procedure utilized by VTG program 15. A first step 32 provides for selecting an instruction list from an array of instruction lists. The array of instructions lists is provided by the user through input file 12. This selection process is discussed in more detail with reference to FIG. 3. Next, at step 34, an instruction is chosen from the selected instruction list. The selection process is discussed in more detail with reference to FIG. 4. Next, at step 36, user-selected biasing options are applied to the operands of the selected instruction. Next, at step 38, with the instruction completely defined, control is passed to the functional model 20 of the VTG program which then executes the instruction and produces the next state in the user registers 18. Next, at a step 40, a determination is made whether a predefined instruction limit has been reached. In the event the instruction limit has not been reached, proceed to step 42. If the instruction limit has been reached, program execution is stopped. At step 42, a determination is made whether the number of instructions selected form the list has reached the value specified by the user variable, pick. In the event the pick value has not been exhausted, flow continues at step 34. In the event that pick value has been exhausted, flow continues at the beginning of step 32. This flow is continued until the instruction limit is reached.

FIG. 3 illustrates in flow diagram form the detail of step 32 of FIG. 2. At step 32a, a user-specified list selection discipline variable, ListOrd determines whether a sequential or random manner of choosing among the elements of the array of instruction lists will be used. In the event a sequential manner is chosen, flow proceeds to step 32c. In the event a random manner is chosen, flow proceeds to step 32b. At step 32b, one instruction list from the array of instruction lists is selected at random for further processing. When flow proceeds to step 32c, the next instruction list of the array of instruction lists will be chosen for further processing. Flow from step 32b and 32c proceeds to step 34 in FIG. 2.

FIG. 4 illustrates in flow diagram form a detailed view of step 34. Step 34a queries a user-specified variable, InstOrd, to determine the manner of picking instructions from the list of instructions. If the InstOrd variable is set to sequential, flow proceeds to step 34c. If the InstOrd variable is set to random, flow proceeds to step 34b. At step 34b, an instruction is selected at random from the list of instructions. At step 34c, the next sequential instruction in the list is chosen. Flow 34b and 34c proceed to step 36 of FIG. 2.

Figure 5:
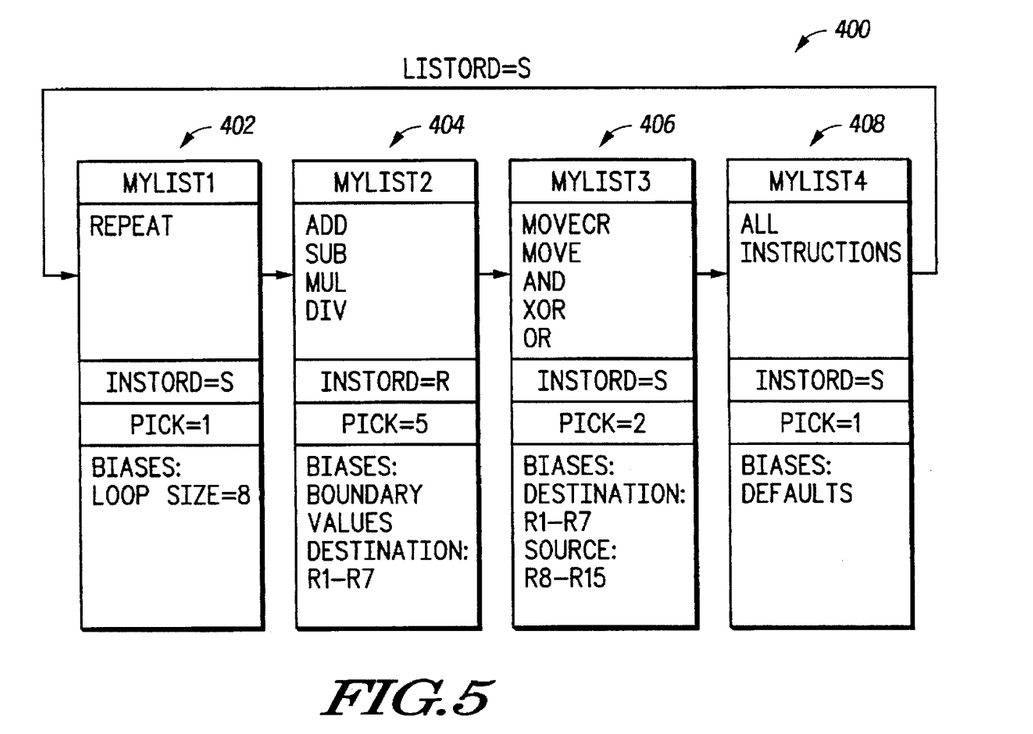
FIG. 5 illustrates a list structure which is utilized by the method of FIGS. 2-4 to create a set of randomized test instructions in accordance with the present invention.

FIG. 5 illustrates an example for generating a group of nine instructions in accordance with the present invention. The flow 400 utilizes an array of four instruction lists comprising arrays 402, 404, 406, and 408. Each of the arrays 402, 404, 406, and 408 comprise a specific data structure comprised of a list identification field, a list of instructions field, an instruction selection discipline field, a field for number of selections to be made from the list of instructions, and a field for biasing information provided by the user. The list identification field uniquely identifies each instruction list in the array of lists. The list of instructions field includes the instructions which can be chosen from that list. The instruction selection discipline is provided in accordance with step 34 of FIG. 2. The number of selections to be made from the list is identified as a user-specified variable, pick, which is in accordance with the determination of step 42 of FIG. 2. The biasing method selected by the user is in accordance with step 36 of FIG. 2.

In operation, the instruction generator 16 (FIG. 1) accesses the list identified as mylist1 402 with a discipline of sequential and a pick of one in order choose the first instruction repeat, which is the only instruction in the example. Proceeding from mylist1, the instruction generator 16 would proceed to the list identified as mylist2 404, which has a discipline of random and a pick of 5. For mylist2 404, the instruction generator 16 randomly picks 5 instructions from the list {add, sub, mult, div}. Next, the instruction generator 16 processes information in the list identified as mylist3 406 which has a discipline of sequential and a pick of 2. For the first pass through mylist3 406 the first two instructions are chosen because of the sequential designator. In the final list, identified as mylist4 408, the selection discipline is random and the pick value is one. In this situation, a single instruction is picked from all possible instructions at random and included in the instruction sequence.

Figure 6:
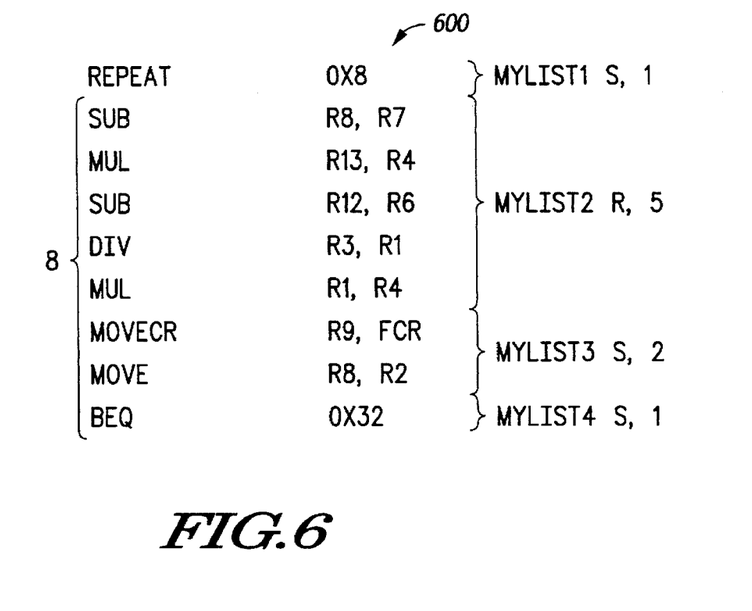
FIG. 6 illustrates an example set of test instructions generated using the methodology of FIGS. 2-4 along with the data structure illustrated in FIG. 5 in accordance with the present invention.

FIG. 6 illustrates a possible outcome from the flow of FIG. 5. In the instruction sequence 600, mylist1 generates a single instruction which is repeat. The list, mylist2, generates a random sequence of five instructions from its instruction list. In instruction sequence 600, this consists of the five instruction sequence {sub, mul, sub, div, mul}. Note that the source and destination of each of these instructions, as previously discussed, is dynamically chosen from user-specified biasing information provided in the input file 12. The list, mylist3, provides for a sequential discipline with a pick value of two. In this case, the first two instructions of mylist3 are selected, movecr and move, and the source and destination registers are dynamically generated in accordance with the biasing preferences specified by the user. In the final list, mylist4 408, a single instruction is chosen at random from the list of all possible instructions. Here, the instruction beq is selected.

Figure 7:
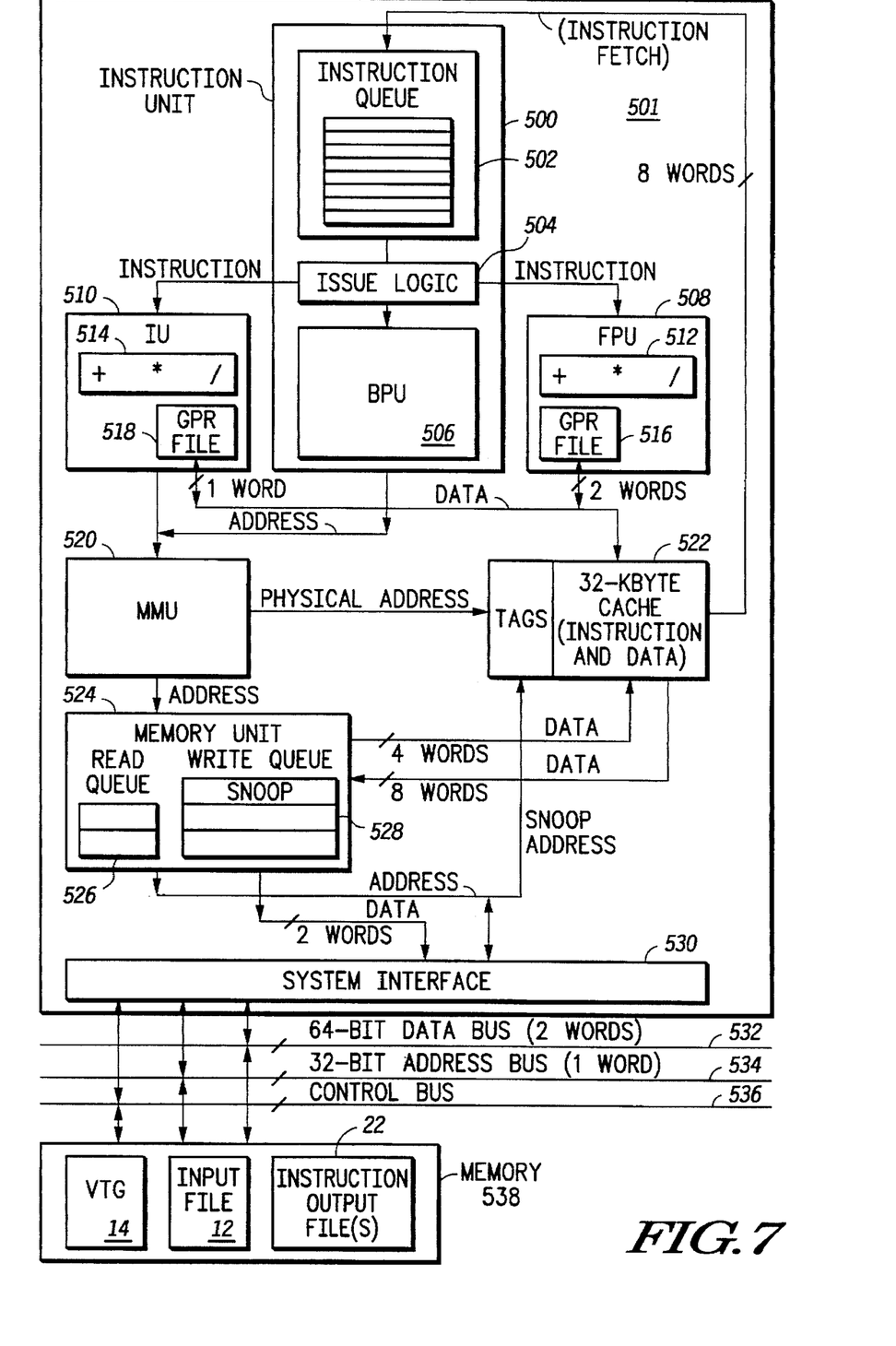
FIG. 7 illustrates, in a block diagram, a computer system which is used to generate a randomized sequence of instructions for use in the testing of a microprocessor.

FIG. 7 illustrates a data processing system for performing the pseudo-random instruction generation discussed herein. FIG. 7 illustrates a data processor 501. Data processor 501 has an instruction unit 500 which contains a plurality of instruction queues 502. The instruction unit 500 receives computer instructions from a memory 538 in FIG. 7 and stores these instructions in an instruction queue 502. Instructions are then selected from the instruction queue 502 via issue logic 504. The instructions may be selected in order or out of programmed order depending on the particular architecture of data processor 501. The issue logic 504 then determines whether the instruction fetch from the queue 502 is a branch instruction, an integer instruction, or a floating point instruction. Depending on the type of instruction detected by the issue logic 504, the instruction is dispatched to one of either an integer unit 510, a branch prediction unit 506, or a floating point unit 508. Therefore, processor 501 is a superscalar architecture capable of concurrently processing up to three operations as one time.

The integer unit 510 is used to perform integer math operations and has circuitry to perform addition, multiplication, subtraction, and division operations via logic 514. A general purpose integer register file 518 is located within the integer unit 510 for storing data values on a temporary basis for use by the integrated unit 510. The branch prediction unit 506 is used to predict the direction of branches (e.g. either branch taken or branch not taken) and controls the execution flow of the computer instruction execution in an orderly manner. The floating point unit 508 is used to perform mathematical floating point operations via math circuitry 512. Floating point unit 508 contains a floating point general purpose register file 516 which contains floating point values for a transitory period of time for efficient access and use.

Data processor 501 contains a unified instruction and data cache 522 which stores tags and data/instruction information received from external memory 538. In a different architecture, a segmented instruction and data cache may replace the unified data cache 522 in FIG. 7. Cache 522 indicates that tag bits are stored which are used to identify various characteristics of the data stored in the cache. Data processor 501 contains a memory management unit 520 which is used to receive addressing information from the mathematical units 510, 506, and 508. Once receiving these logical addresses, the MMU 520 performs a logical to physical address translation and provides this physical address to both the cache 522 and the memory unit 524. If the memory location translated by the MMU 520 is found in the cache, the cache 522 is accessed to provide the data to the functional units 510, 506, and 508. If the data value is not located in the cache 522, then the memory unit 524 performs read or write operations through the system interface 530 to external memory 538 to access any data values that are needed by the units 510, 506, and 508. Therefore, the data processor 501 is one type of data processor which is used for executing computer instructions in order to generate the test instructions as taught herein.

The data processor 501 interfaces to external memory via a 64-bit data bus 532, a 32-bit address bus 534, and a control bus 536. Through these buses, the data processor 501 can access and execute the Verification Test Generator (VTG) program 14 stored in external memory 538. In a preferred embodiment, the program 14 is a C++ program. FIG. 7 illustrates that the files accessed by the VTG program 14, such as the input file 12 and the output file(s) 22 are stored in the computer memory 538.

While the present invention has been illustrated and described with reference to specific embodiments, further modifications and improvements will occur to those skilled in the art. For example, plurality, as used herein, is intended to mean any integer value between 2 and infinity and should not be limited to a particular constant or sub-range within 2 to infinity. Memory or computer memory, as used herein, means any EPROM, EEPROM, ROM, SRAM, DRAM, VRAM, RAM, magnetic storage, optical storage, tape storage, flash memory storage, compact disk (CD), ferromagnetic storage, ferroelectric storage, or like storage device for storing computer executable code or computer data. It is important to note that the pick value can be larger than the number of elements in the instruction list (see list 504 for example). It is to be understood, therefore, that this invention is not limited to the particular forms illustrated and that it is intended in the appended claims to cover all modifications that do not depart from the spirit and scope of this invention.

We claim:

1. A method for selecting instructions for use in a process for generating dynamically-biased pseudo-random test patterns, the method comprising:

providing an instruction list having a list identifier, an instruction set having at least one instruction, a pick value, and an instruction selection discipline value;

selecting an instruction from the instruction set based on the selection discipline value, wherein the discipline value specifies a manner of selecting; and repeating the step of selecting based on the pick value.

2. The method of claim 1, further including the step of:

storing the instruction in an intermediate file, wherein the intermediate file contains a sequence of instructions to be processed for execution, wherein the sequence of instructions contains at least one instruction.

3. The method of claim 1, wherein:

the step of providing includes providing a plurality of instruction lists; and the step of selecting includes selecting the instruction from the instruction set of one of the plurality of instruction lists.

4. The method of claim 3, further including the step of:

repeating the steps of providing, selecting, and repeating based on a desired number of instructions and other biasing information which effects the instruction.

5. The method of claim 1, further including the steps of:

loading a set of user preferences; and generating a computer instruction based on the set of user preferences.

6. A method for generating test instructions, the method comprising the steps of:

(a) forming a plurality of instruction list structures in computer memory, each instruction list structure in the plurality of instruction list structures having a name field, a list containing at least one computer instruction, a discipline field for determining a manner for selecting computer instructions from the list containing at least one computer instruction, a pick field which indicates the number of instructions which are to be chosen from the list containing at least one computer instruction, and a bias field which defines a manner in which operands are to be generated for the computer instructions selected from the list containing at least one computer instruction;

(b) selecting one list structure among the plurality of instruction list structures as a selected list structure;

(c) selecting a selected computer instruction from the list containing at least one computer instruction which is within the selected list structure, the selecting being performed in accordance with the discipline field of the selected list structure;

(d) determining additional information for the selected computer instruction in accordance with the bias field of the selected list structure;

(e) repeating steps (c) through (e) until a proper number of selected instructions are processed in accordance with the pick field of the selected list structure; and (f) repeating steps (b) through (f) for another selected list structure until a termination condition is determined.

7. The method of claim 6, including the step of:

(g) writing the selected computer instruction to an instruction output file.

8. The method of claim 6, wherein the discipline field comprises a designator for a random selection, and a designator for a sequential selection.

9. The method of claim 6, including the step of:

(g) executing the selected computer instruction to keep track of a state of the system.

10. The method of claim 6, wherein step (b) comprises:

(b) selecting one list structure among the plurality of instruction list structures as a selected list structure based on a discipline field for the plurality of list structures.

11. The method of claim 6, wherein the termination condition of step (f) comprises determining when a user-specified number of instructions has been processed.

12. The method of claim 6, wherein the step (b) further comprises:

choosing an instruction list structure out of the plurality of instruction list structures in a pseudo-random manner.

13. The method of claim 7, wherein the method includes the step of:

(h) testing a device under test based on the instruction output file.

14. The method of claim 13, wherein the device under test is a microprocessor.

15. The method of claim 13, wherein the device under test is a simulation model.

16. The method of claim 7 having an input file having the list containing at least one computer instruction, the discipline field, the pick field, and a bias field, wherein the method includes the step of:

(h) resubmitting the instruction output file as the input file.

17. A method for generating dynamically-biased pseudo-random test patterns for execution by an execution device, the method comprising:

(a) creating a plurality of instruction lists in computer memory, each instruction list in the plurality of instruction lists having a list identifier, an instruction set listing at least one computer instruction, a pick value, and an instruction selection discipline value;

(b) selecting a selected instruction list from the plurality of instruction lists;

(c) selecting an instruction from the instruction set of the selected instruction list based on the selection discipline value of the selected instruction list, wherein the discipline value specifies a manner of selecting;

(d) repeating the steps (c)–(d) a number of times determined by the pick value of the selected instruction list to create a list of selected instructions in computer memory; and (e) repeating the steps (b)–(e) until a complete computer file of selected instructions exists in computer memory.

18. The method of claim 17 further comprising:

(f) altering the complete computer file to obtain an executable file of test instructions;

(g) applying the test instructions from the executable file to the execution device for execution to determine if the execution device is properly operating.

19. The method of claim 18 further comprising:

(h) determining an expected output which is believed to be the correct output from the execution device due to execution of the test instructions from the executable file;

(i) capturing the actual output of the execution device from executing the test instructions from the executable file;

(j) comparing the actual output and the expected output to determine if the correct output was achieved as the actual output.

20. A data processor for generating test instructions used for testing a device under test, the data processor comprising:

a central processing unit (CPU); and
computer memory coupled to the central processing unit (CPU), the computer memory containing:
an array of instruction list structures wherein each instruction list structure in the array of instruction list structures contains a list of instructions;
a verification test generator which accesses the array of instruction list structures using a process defined by a list discipline field, the verification test generator choosing a plurality of instructions from at least one of the instruction list structures as a portion of the test instructions before another instruction list structure is chosen for processing; and
an output test instruction file which is used to store the plurality of instructions chosen by the verification test generator.

21. The data processor of claim 20 wherein the test instruction file is fixed in size to a limited number of instructions.

22. The data processor of claim 20, wherein each instruction list structure in the array of instruction list structures contains a discipline field which indicates whether the test instructions are chosen from the list of instructions in a random manner or in a sequential manner.

23. The data processor of claim 20 wherein computer code executes each test instruction as each test instruction is chosen in order to maintain an execution state so that subsequently chosen test instructions can be properly created.

24. The data processor of claim 20, wherein each instruction list structure in the array of instruction list structures contains a pick field which indicates how many test instructions are chosen from the list of instructions before another instruction list structure is selected.

25. The data processor of claim 20, wherein each instruction list structure in the array of instruction list structures contains a bias field which indicates how operands are determined for each test instruction.

26. The data processor of claim 20, wherein the output test instruction file is assembled into executable code and applied to a device under test to test an operation of the device under test.

27. The data processor of claim 20, wherein the output test instruction file is assembled into executable code and applied to a model under test to test an operation of the model under test.

28. A verification test generator comprising:

means for creating a plurality of list structures;
means for selecting a selected list structure from the plurality of list structures; and
means for selecting two or more test instructions from the selected list structure and writing the two or more test instructions to a test instruction file before selecting another selected list structure to continue test instruction generation; and
means for determining a discipline for selecting test instructions for each list structure in the plurality of list structures.

29. A test instruction generator stored on computer readable medium, the test instruction generator comprising:

a first plurality of computer instructions for creating a plurality of list structures, each list structure comprising a list containing at least one computer instruction, a discipline field for determining a manner for selecting computer instructions from the list containing at least one computer instruction, a pick field which indicates the number of instructions to be chosen from the list containing at least one computer instruction, and a bias field which is used to define a manner in which operands are to be generated for the computer instructions selected from the list containing at least one computer instruction;
a second plurality of computer instructions for selecting a selected list structure from the plurality of list structures using a global discipline methodology;
a third plurality of computer instructions for selecting two or more test instructions from the list of at least one computer instruction and writing the two or more test instructions to a test instruction file before selecting another selected list structure to continue test instruction generation; and
a fourth plurality of computer instructions for applying assembled test instructions from the test instruction file to a device under test to test the device under test for proper operation.

30. A data structure for allowing the creation of a data file containing test instructions for testing a CPU, the data structure comprising:

at least one list structure formed in computer memory wherein each list structure in the at least one list structures comprises:
a list identifier field;
a list of at least one test instruction which is selectable by an algorithm for inclusion in a test file used for testing an electrical device;
a discipline field which indicates a manner in which the test instructions are to be selected from the list of at least one test instructions;
a pick field which is used to indicate a number of test instructions to be sequentially selected from the list structure before another list structure is selected; and
a bias field which indicates a manner in which operands are to be created for use in each test instructions selected from the list of at least one test instructions.

31. A method for testing a microprocessor by generating and utilizing a sequence of pseudo random test instructions, the method comprising:

providing an instruction list having a list identifier, an instruction set having at least one instruction, a pick value, a bias field, and a selection discipline value;

selecting a number of selected instructions from the instruction set equal to the pick value, wherein the discipline value specifies a manner of selecting;

generating operands for the selected instructions using the bias field;

storing the selected instructions in a test file and storing the expected test results in a result file;

executing of the number of instructions using an integrated circuit design file stored in memory to maintain a state of the machine for generating proper operands of subsequent test instructions;

manufacturing a plurality of integrated circuits in accordance with the integrated circuit design file; and applying an executable embodiment of the test file to the plurality of integrated circuits to test the plurality of integrate circuit for proper operation by comparing actual test results to contents of the result file.

* * * * *

UNITED STATES PATENT AND TRADEMARK OFFICE
CERTIFICATE OF CORRECTION

PATENT NO. : 5,646,949
DATED : July 8, 1997
INVENTOR(S) : William C. Bruce, Jr. et al.

It is certified that error appears in the above-identified patent and that said Letters Patent is hereby corrected as shown below:

On the title page, item [56] insert:

5,202,889   4/1993      Aharon et al.............................371/27

Signed and Sealed this

Twenty-third Day of February, 1999

Attest:

Q. TODD DICKINSON

Attesting Officer

Acting Commissioner of Patents and Trademarks